US009299465B1

(12) United States Patent
Grunwald et al.

(10) Patent No.: US 9,299,465 B1
(45) Date of Patent: Mar. 29, 2016

(54) ELECTRON BEAM SYSTEM

(71) Applicant: PCT Engineered Systems, LLC, Davenport, IA (US)

(72) Inventors: Rily Carl Grunwald, Eldridge, IA (US); John Charles Drenter, Davenport, IA (US)

(73) Assignee: PCT Engineered Systems, LLC, Davenport, IA (US)

( * ) Notice: Subject to any disclaimer, the term of this patent is extended or adjusted under 35 U.S.C. 154(b) by 35 days.

(21) Appl. No.: 14/501,815

(22) Filed: Sep. 30, 2014

(51) Int. Cl.
*H01J 37/30* (2006.01)
*B05D 3/06* (2006.01)
*G21F 3/00* (2006.01)
*G21K 5/02* (2006.01)

(52) U.S. Cl.
CPC ... *G21F 3/00* (2013.01); *G21K 5/02* (2013.01)

(58) Field of Classification Search
USPC .......... 250/428, 432 R, 453.11, 455.1, 492.1, 250/492.2, 492.3, 515.1, 526; 427/331, 427/343, 345, 359, 360, 444, 445, 496; 264/349, 405, 424, 425, 446, 447, 456, 264/470, 485
See application file for complete search history.

(56) References Cited

U.S. PATENT DOCUMENTS 5,657,876 A * 8/1997 Drenter .................... B07B 1/005 209/223.1
6,833,551 B2 * 12/2004 Avnery .................... G21K 5/10 250/492.1
7,282,726 B2 10/2007 Usami
7,324,630 B2 1/2008 Avnery
7,330,525 B2 2/2008 Singh
7,348,555 B2 3/2008 Usami et al.
7,767,987 B2 8/2010 Eguchi et al.
8,093,574 B2 1/2012 Stichelbaut et al.
8,106,369 B2 * 1/2012 Drenter ............... D06M 10/005 250/492.3
2003/0094582 A1 5/2003 Weiss et al.
2005/0184256 A1 8/2005 Chauhan et al.
2006/0011133 A1 1/2006 Nishibayashi
2006/0124866 A1 6/2006 Hisatsugu
2009/0184262 A1 7/2009 Bartel et al.
2010/0026161 A1 2/2010 Iijima et al.
2010/0230618 A1 * 9/2010 Drenter .................... G21K 5/10 250/506.1
2013/0083896 A1 4/2013 Watanabe

FOREIGN PATENT DOCUMENTS

JP 09-101400 4/1997
JP 2005/214709 A 8/2005

OTHER PUBLICATIONS

Akzo Nobel Coatings, Inc., "Development of materials and equipment for the rapid, room temperature, low energy electron beam curing of coatings on three-dimensional articles", DOE Grant Proposal, Control No. 0560-2107, 2011.

(Continued)

*Primary Examiner* — Bernard E Souw
(74) *Attorney, Agent, or Firm* — Woodard, Emhardt, Moriarty, McNett & Henry LLP

(57) ABSTRACT

Apparatus for electron beam treatment of three-dimensional parts that includes cavities in a shielded rotating drum that preferably includes additional rotation mechanism for rotating parts within cavities in said drum. Radiation associated with the electron beam emitter is substantially shielded by the combination of the drum and the additional radiation shielding. The rotating drum is preferably made of at least four sections axially stacked, and its shielding properties are enhanced by including lead filled holes drilled in the sections.

38 Claims, 9 Drawing Sheets

(56) References Cited

OTHER PUBLICATIONS

Email to Karl E. Swanson from Robert Dye, with PowerPoint of Gerard Giroux and Robert Dye of Lexmark International, Inc., "E-Beam Workstation Concept", Feb. 7, 2013.

Semi-Continuous EB System for 3D Parts, Presentation, Oct. 1, 2013.

Written Opinion and Search Report from PCT Application No. PCT/US2015/052837 dated Jan. 13, 2016.

* cited by examiner

ELECTRON BEAM SYSTEM

BACKGROUND OF THE INVENTION

Electron beam apparatuses have a variety of applications including curing inks and coatings in a printing process, laminating, or cross-linking of polymers in plastic parts. In a process known as irradiation, these apparatuses direct accelerated electrons at a target material to ionize that material. One of the byproducts of electron beam irradiation is the generation of secondary radiation. This secondary radiation may be harmful to people or may degrade parts, materials and lubricants, if not properly shielded.

Due to the negative effects of secondary radiation it is desired for an electron beam apparatus to include radiation shielding that limits the amount of secondary radiation that escapes into the environment. However, providing effective radiation shielding to an electron beam apparatus can significantly increase the size and cost of the apparatus and make it difficult to access the electron beam emitter when repair is needed. Therefore, it is desirable to improve the operation of these apparatuses, decrease cost, and improve serviceability. Various optional features herein, alone or in combination, may address one or more of these considerations.

SUMMARY OF THE INVENTION

In some embodiments, an apparatus for electron beam treatment of three-dimensional parts is shown that includes an electron beam emitter, a rotatable drum, an additional mechanism to move the part within a cavity in said rotatable drum, and additional radiation shielding. The rotatable drum has a cavity in its preferably cylindrical surface that is sized to fit a three-dimensional part to be irradiated with the electron beam. The rotatable drum additionally acts as a radiation shield for the electron beam and associated secondary radiation. Additional radiation shielding surrounds the electron beam emitter except for a portion of said rotatable drum, including an area that allows the three-dimensional part to be inserted into the cavity. Radiation associated with the electron beam emitter is substantially shielded by the combination of the drum and the additional radiation shielding.

Another embodiment of an apparatus for electron beam treatment not limited to treatment of three-dimensional parts includes an axially segmented drum. This apparatus includes an electron beam emitter and a rotatable drum. The rotatable drum has a cylindrical surface and is positioned adjacent to the electron beam emitter. Material between the drum and the electron beam emitter can be irradiated by said electron beam emitter. The rotatable drum is constructed from at least four separate axially stacked sections that are fixed together.

Other embodiments of an apparatus for electron beam treatment use a rotatable drum that serves as an integral part of the radiation shield, which shielding uses numerous circular-cross-section paths within said drum, each containing a shield material different from the primary structural material of the drum. The shield material is preferably lead, tungsten, or uranium (such as depleted uranium), or an alloy containing at least 50% lead with tin or antimony. The drum preferably uses steel as its primary structural material and has a substantially cylindrical surface.

DESCRIPTION OF PREFERRED EMBODIMENTS

Figure 1:
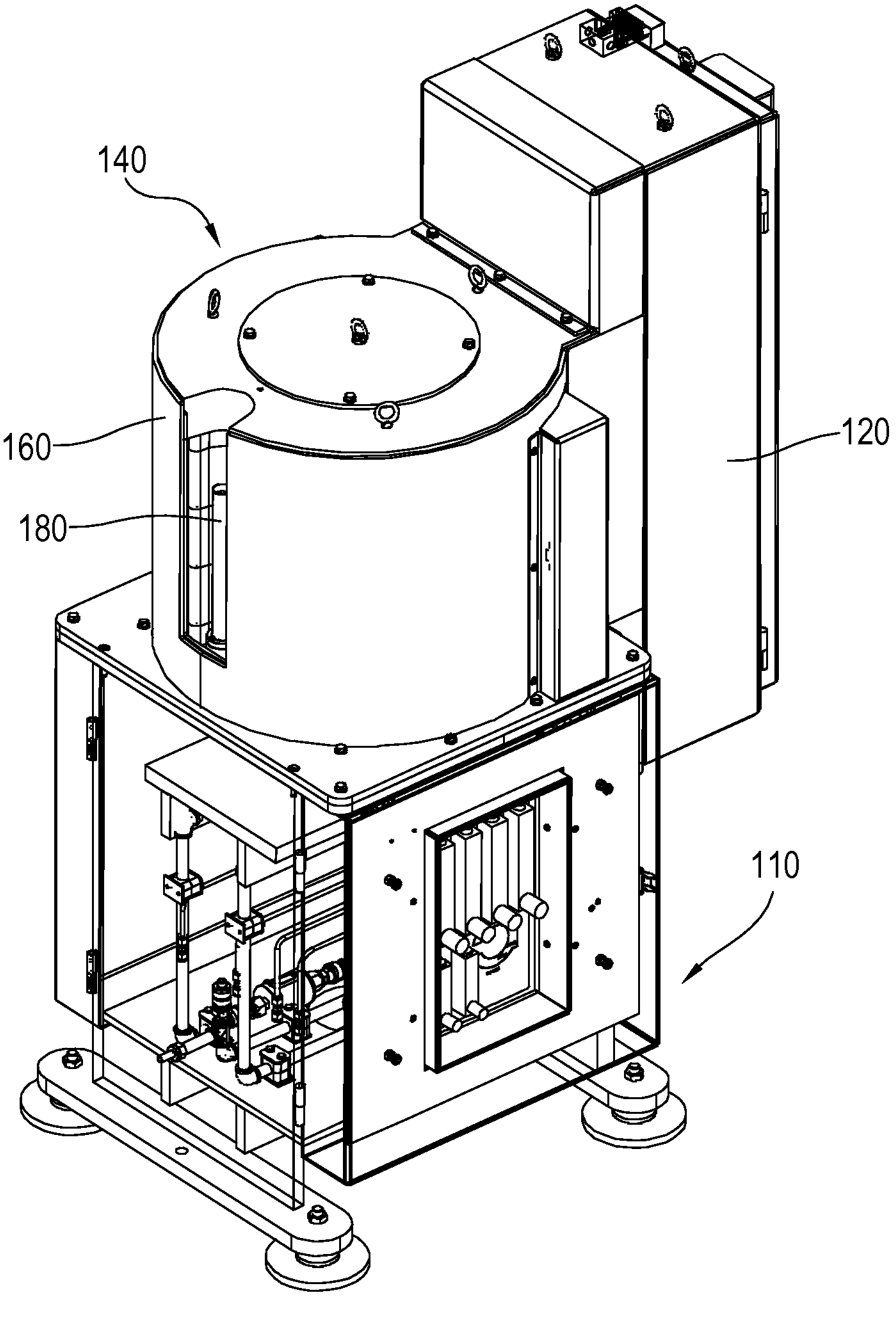
FIG. 1 is a perspective of an embodiment of applicants' electron beam treatment apparatus. The term "perspective" is more precisely an axonometric projection.

For the purposes of promoting an understanding of the principles of the invention, reference will now be made to the embodiments illustrated in the drawings and specific language will be used to describe the same. It will nevertheless be understood that no limitation of the scope of the invention is thereby intended, such alterations and further modifications in the illustrated device, and such further applications of the principles of the invention as illustrated therein being contemplated as would normally occur to one skilled in the art to which the invention relates.

FIG. 1 illustrates an example of an apparatus 100 for electron beam treatment of three-dimensional (3D) parts. Apparatus 100 includes a base 110, an electron beam emitter assembly 120, a drum assembly 140, and drum shield 160. A 3D part 180 is loaded into drum assembly 140. A portion of beam emitter assembly 120 sits on top of base 110 and extends outward from the back side of base 110. Drum assembly 140 sits on top of base 110. The back of drum assembly 140 abuts the front of electron beam emitter assembly 120. Drum shield 160 forms the outer portion of drum assembly 140.

Figure 2:
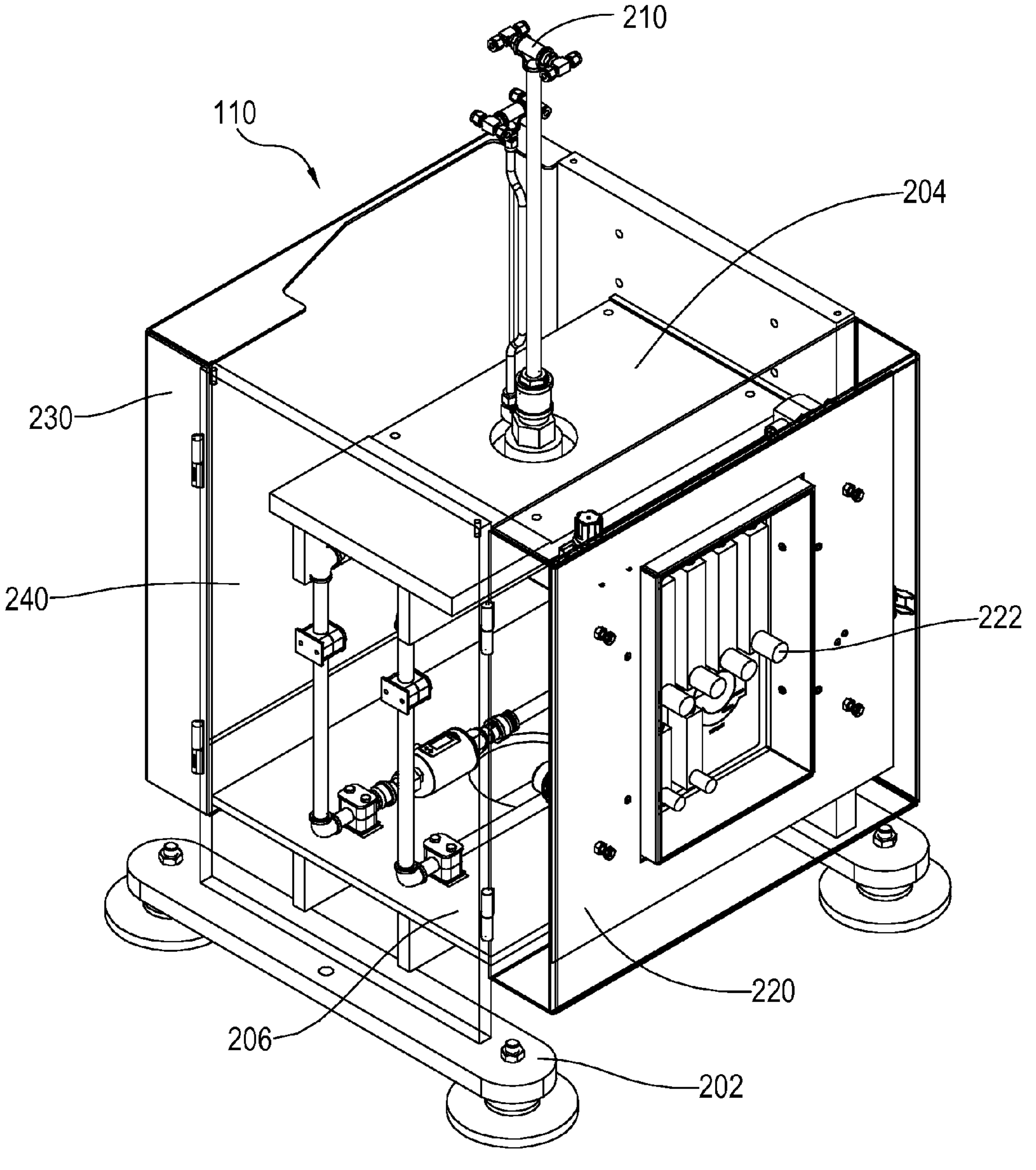
FIG. 2 is a perspective view of a base as illustrated in the apparatus of FIG. 1.

As seen in the embodiment shown in FIG. 2, base 110 sits on legs 202 and includes two shelves 204, 206. Shelf 204 gives added support for drum assembly 140 when drum assembly 140 is attached to base 110. Shelf 206 supports the piping of water system 210. An opening in shelf 204 allows pipes from water system 210 to extend upward from shelf 206 and out the top of base 110 toward drum assembly 140, through a dual path rotatable coupling (not shown) that allows the upper piping to rotate along within the drum 305 in FIG. 3 that is within drum assembly 140 while the lower portion of the water system 210 fluidly connected to it remains non-rotatably coupled to the base 110.

An inert gas control panel 220 is attached to one side of base 110. Knobs 222 on control panel 220 allow adjustment of different areas of inert gas flow to be supplied adjacent the drum 305 in FIG. 3 within drum assembly 140. Other control features may be added if desired.

A front door 240 covers the front of base 110. In the embodiment shown, door 240 is transparent allowing a user to easily see the components stored in base 110. However, in other embodiments, door 240 may be opaque. Door 240 opens and closes to allow access to the interior of base 110 for making repairs, adjusting the water system 210, or for other purposes.

Figure 3:
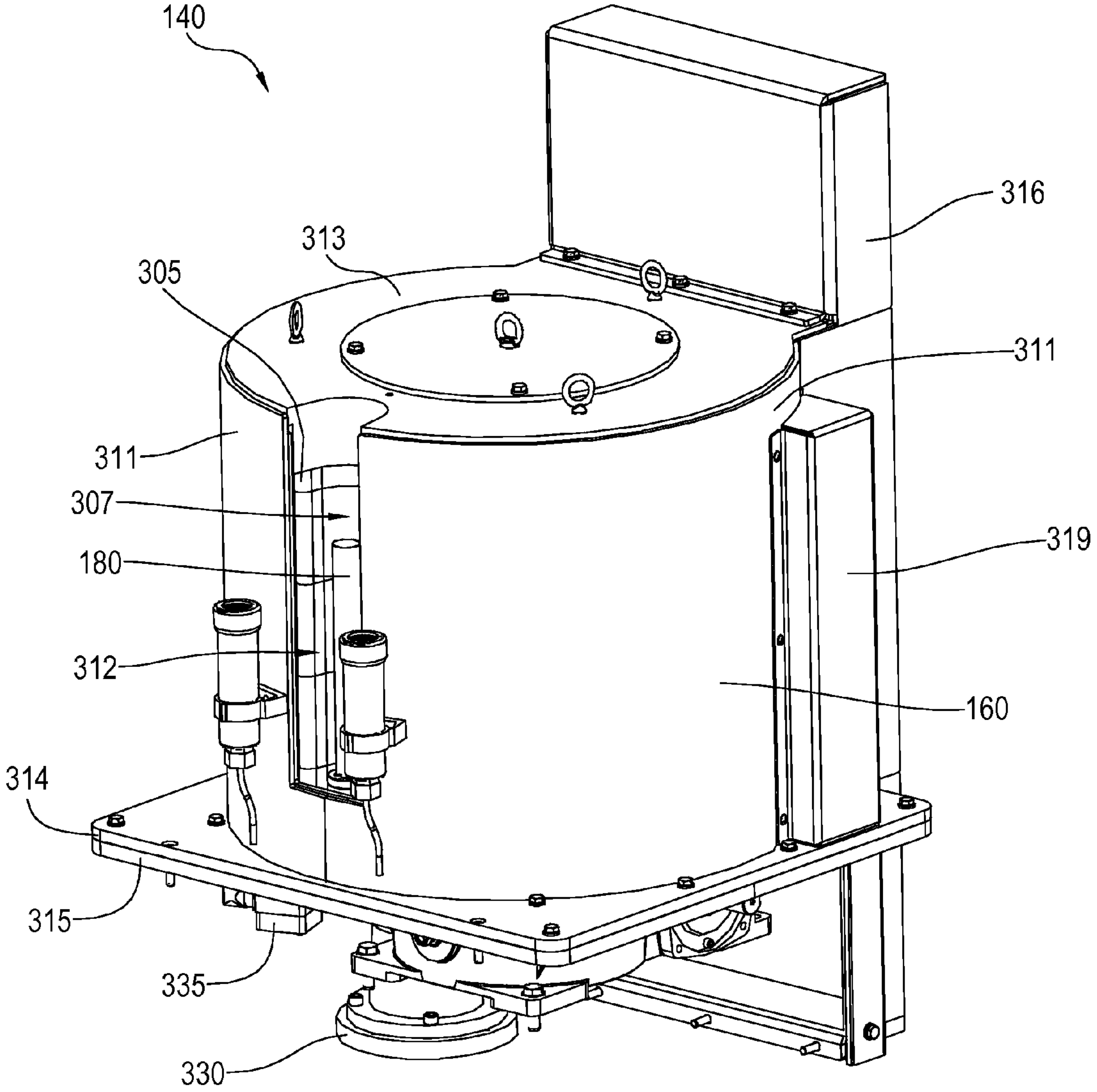
FIG. 3 is a perspective view of a drum assembly as illustrated in the apparatus of FIG. 1.

FIG. 3 shows a view of an embodiment of drum assembly 140. Drum assembly 140 includes a rotatable drum 305 that constitutes a radiation shield. Drum 305 has a generally cylindrical surface and two ends. The surface of drum 305 has a cavity 307 on its surface that extends radially inward into drum 305 and is sized to hold a 3D (three dimensional) part 180 that is to be treated. In some embodiments, drum 305 may have more than one cavity. For example, drum 305 may have two or three cavities spaced equidistantly around the perimeter of drum 305. In other embodiments, the cavities may be spaced at unequal distances from each other around the perimeter of drum 305.

Drum 305 may be constructed from a variety of structural materials. In some embodiments, the structural material for drum 305 is steel or aluminum. In some embodiments, drum 305 also includes shielding material made from lead, uranium, tungsten or a lead alloy where the lead alloy is composed of more than 50% lead and may additionally include tin or antimony.

In addition to being a radiation shield itself, drum 305 is also partially surrounded by a drum shield structure 160 made from material that is effective, when combined with the drum, for shielding radiation. For example, shield structure 160 may be made of the same material as the drum or from a different material. Exemplary shielding materials include lead, tungsten, uranium, or an alloy containing at least 50% lead with tin or antimony.

Side shields 311 surround the sides of drum 305. Side shields 311 are shaped so an opening 312 is formed, exposing drum 305. In some embodiments, this opening is shaped to have a similar size as cavity 307 so when cavity 307 is aligned with opening 312, a 3D part 180 may be fit into cavity 307. In some embodiments that are not shown, there are multiple openings 312 that form separate positions for loading and unloading 3D part 180 from cavity 307.

In the embodiment shown, side shields 311 are formed from two pieces of material that are joined together at the base of cavity 307 to make a complete shield. However, in other embodiments, side shields 311 may be formed from a single piece of material.

The size of cavity 307 in the side of the drum 305 may vary in width, height, or depth. It is preferred that the width of the cavity spans between 15°-50° the arc of drum 305 (out of 360 total degrees) and more preferably within 25° to 40°. It is preferred that the ratio of the height of cavity 307 to the height of drum 305 is between 0.7 and 0.95. It is preferred that the ratio of the minimum distance from the depth of cavity 307 to the axis of rotation compared to the maximum radius of the drum surface is between 0.6 and 0.8. However, in other embodiments, cavity 307 may be any size that fits within drum 305, and is yet not so large as to allow escaping radiation to bypass the drum through the cavity. These above dimensions are simply preferred values and are not meant to be limiting.

A top shield 313 is positioned above the top portion of drum 305. Top shield 313 covers the entirety of the top of drum 305. The lower portion of top shield 313 has a contour complementary to the rounded top of drum 305 so as to leave only a very small gap between the two. This enables their closely adjacent curved surfaces to substantially keep straight line radiation from escaping, even though the three cavities each extend to the upper end of the drum. In the embodiment shown in FIG. 3, the top shield 313 includes eyebolts to facilitate removing the top shield so that the drum can be serviced or removed A bottom shield 314 covers the bottom portion of drum 305. In the embodiment shown, bottom shield 314 is rectangular and extends farther than the circular base of drum 305. Bottom shield 314 of drum assembly 140 is connected to the base top cover 315 by screws (see FIG. 1).

Figure 4:
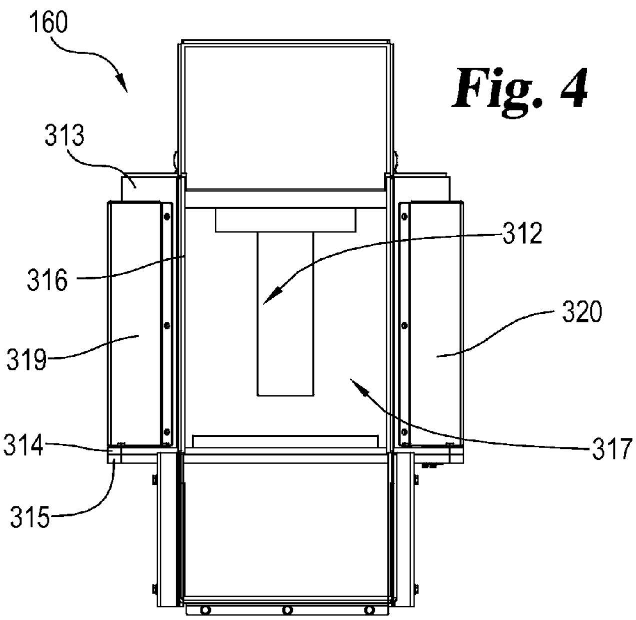
FIG. 4 is a back view of the drum assembly illustrated in FIG. 3.

A back shield 316 in FIG. 3 is a part of drum assembly 140. Back shield 316 includes a frame that extends above and below drum 305 to serve as a part of shield structure 160 and to couple to beam emitter apparatus 120 (see FIG. 1). A large opening 317 in back shield 316 (see FIG. 4) allows drum 305 to be exposed to electron beam emitter apparatus 120.

Near the back of drum 305, shield structure 160 has two nitrogen tube shield covers 319 and 320 (320 is hidden in FIG. 3, but see FIG. 4 or 10) that extend from side shields 311. In the embodiment shown in FIG. 3, nitrogen tube shield covers 319 and 320 are rectangular in shape; however, shield covers 319 and 320 may be any shape that suitably encloses nitrogen supply routes. While nitrogen is preferred when inerting is desired, other gases such as krypton, xenon, neon, helium, argon, or mixtures of two or more of them could be used as well. Carbon dioxide is another gas that could be considered for inerting, but is less preferred.

In some embodiments, shield structure 160 may include grooves or protrusions to attach the different components of shield structure 160 or to interface shield structure 160 with drum 305. Adding grooves or protrusions can increase the effectiveness of the shield by decreasing the number of straight line paths in which radiation may escape. These grooves and protrusions may have various shapes or geometries. Examples of these different shapes or geometries are found in U.S. Pat. No. 8,106,369 to Drenter (incorporated herein by reference).

An indexer 330 is attached to bottom of drum 305 and extends through openings in bottom shield 314 and base 110 top cover 315. When drum assembly 140 is connected to base 110, indexer 330 sits on upper shelf 204, and water system 210 extends upward into drum 305 through an opening in indexer 330. Indexer allows rotation of drum 305 and allows drum 305 to be started and stopped with its cavities in different locations. For example, the indexer allows drum 305 to rotate to a loading position where cavity 307 is aligned with opening 312 to an irradiation position where cavity 307 is positioned between beam emitter assembly 120 and drum 305.

A motor 335 is also attached to the bottom of drum 305 and extends through openings in bottom shield 314 and base 110 top cover 315. Motor 335 is preferably a low inertia motor that provides the power to rotate the 305 about its central axis.

Figure 5:
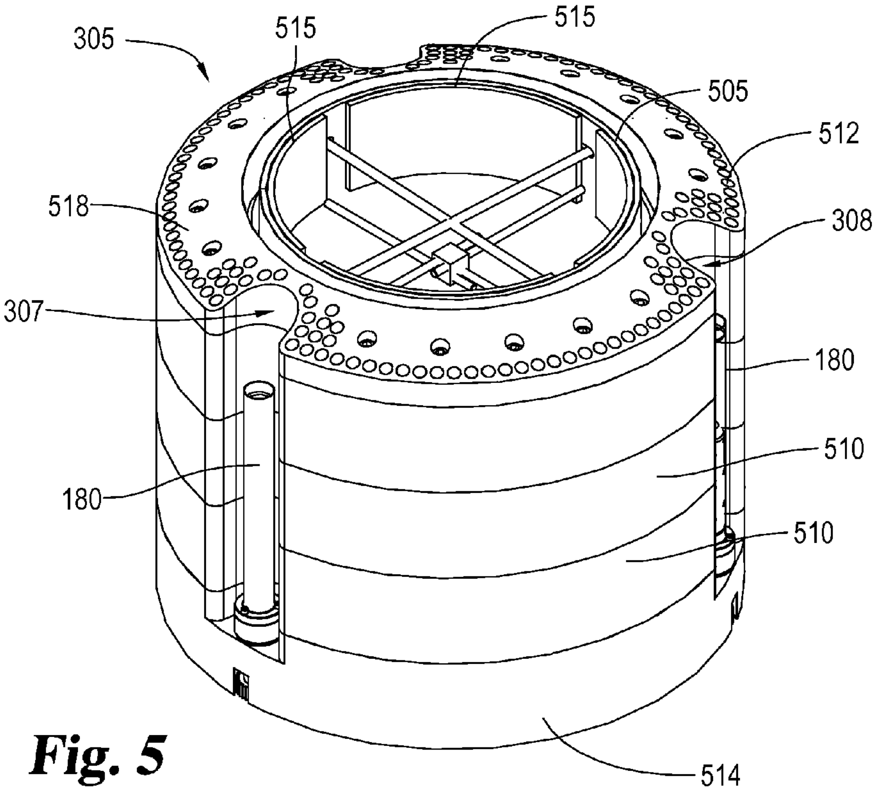
FIG. 5 is a perspective view of a drum from the drum assembly of FIG. 3.

FIG. 5 shows an embodiment of the drum 305 of FIG. 1 without surrounding shield structure 160. The drum 305 shown has three cavities 307 spaced equidistantly around the circumference of drum 305. A 3D part 180 may be inserted into each cavity 307. While three cavities are preferred, any number of cavities from one to 6 or more can be used, and their spacing around the circumference of drum 305 does not have to be equidistant, nor all at the same height. As examples of alternatives not shown, two cavities can be above one another, or six cavities can be positioned in pairs, with each of the three pairs being equidistantly spaced around the circumference.

In the embodiment shown in FIG. 5, drum 305 is cylindrically shaped with an interior space. A cooling drum 505 is secured within the interior of drum 305 so it rotates along with drum 305. While it is preferred that the sides of drum 305 are substantially cylindrical with vertically straight sides, except for where the cavities are located, in an alternative, but less preferred form, the generally cylindrical shape could be more barrel-like, convex—bulging in the middle and more rounded at each end. Such would be encompassed by the term "drum" or "cylindrical" as used in the claims.

Drum 305 is constructed from multiple intermediate drum sections 510, a driven end section 514, and an end shield section 518 that are stacked axially adjacent one another, with the axis of rotation of the drum passing roughly at the center of each section. Each drum section 510 has a plurality of openings 512 surrounding its perimeter. These openings 512 for each section 510 are aligned so that a single opening extends the length of the drum into the bottom drum section. Lead, or some other shielding material like tungsten, uranium, or an alloy with at least 50% lead mixed with tin or antimony, is used to fill openings 512. This allows drum 305 to act as a shield for electron beam radiation. For examples, the lead that is used to fill openings 512 may be solid lead that is continuous between openings 512 in adjacent section 510, put in place either by inserting a piece of cylindrical lead and pressing it into place, or by pouring molten lead into the holes and allowing it to solidify in place. Less preferably lead shot may be used to fill openings 510. Preferably, additional layers of lead 515 are included adjacent the inside of cooling drum 505 to provide further shielding.

End shield section 514 is shaped differently from the other sections 510. Holes 512 do not extend all the way through end shield section 514. This allows molten lead to be poured into holes 512 to create shielding within the drum, without needing to temporarily block the bottom of the holes while the lead is solidifying. Also, sections 510 have corresponding openings that extend through the depth of the entire section to create cavity 307 when sections 510 are stacked axially. End shield section 514 has a notch that forms the base of cavity 307 and provides support for 3D part 180 when 3D part 180 is inserted into cavity 307.

Figure 6:
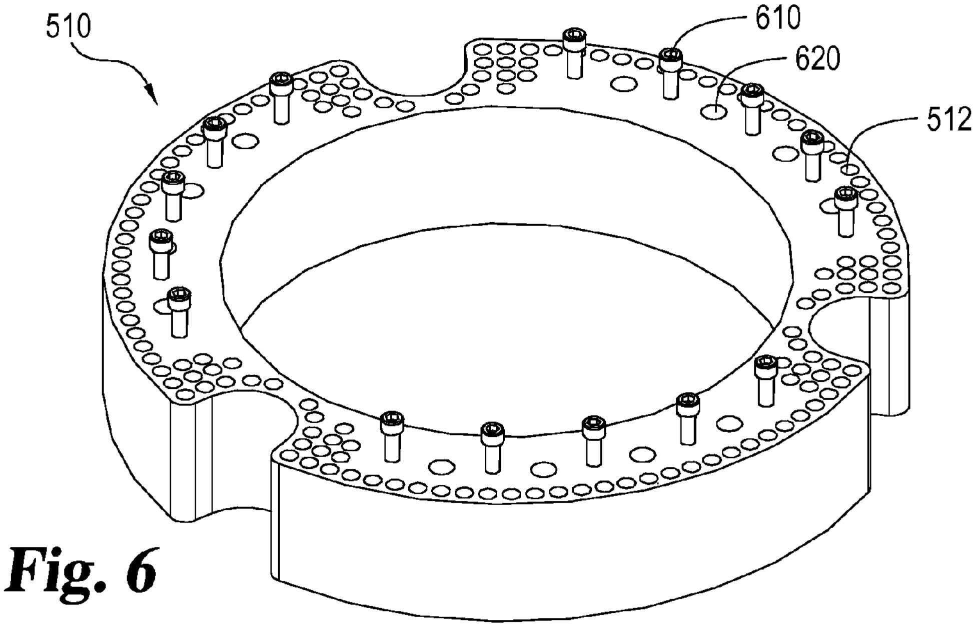
FIG. 6 is a perspective view of a drum section of the drum of FIG. 5.

As seen in FIG. 6, sections 510 are connected using a system of offset screws 610 and screw openings 620. To connect sections 510, a screw 610 is inserted into opening 620. Screw 610 is long enough to extend through the bottom of section 510 and fit into an aligned opening 620 in a different section below the section 510 in which screw 620 was inserted. In the embodiment shown in FIG. 6, openings 620 alternate so that one opening 620 has a screw 610 that connects section 510 and the section above it, and the next opening has a screw 610 that connects section 510 and the section below.

Figure 7:
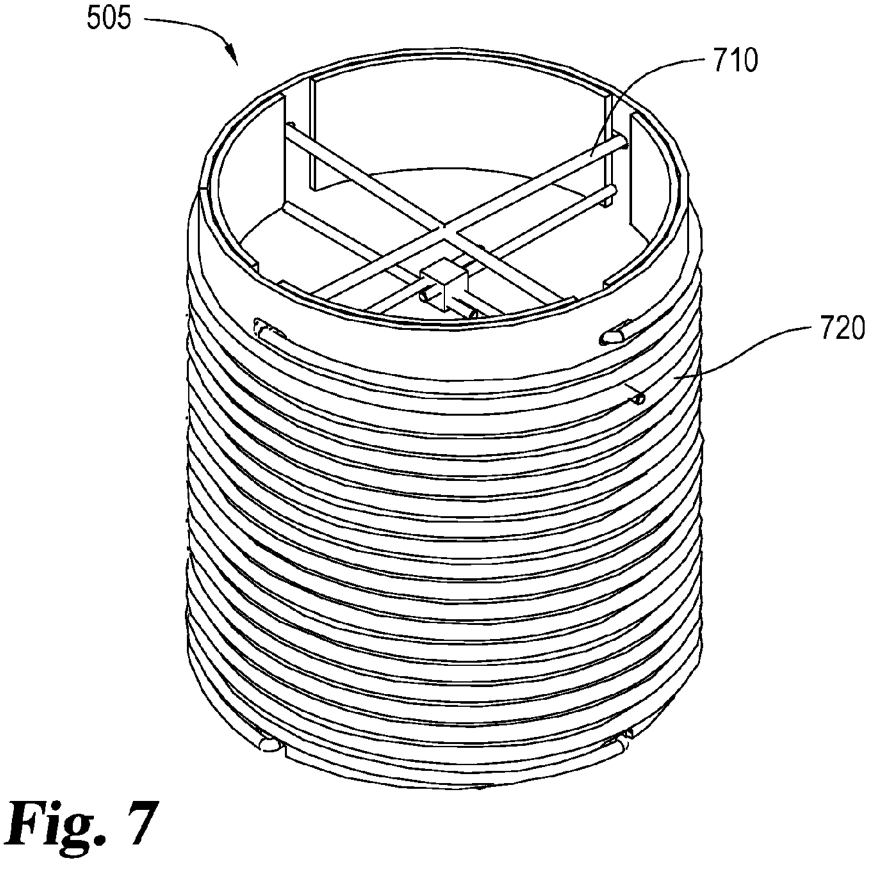
FIG. 7 is a perspective view of a cooling drum of the drum assembly of FIG. 3.

Cooling drum 505 is shown in FIG. 7. Similar to drum 305, it is cylindrically shaped and has a hollow interior. Attachment rods 710 span the diameter of cooling drum 505 and attach cooling drum 505 to drum 305. Four helical cooling pathways 720 encircle cooling drum 505 making multiple rotations around cooling drum 505 to form a helical pattern. Fluid may be run through cooling pathways 720 to keep drum 305 from overheating while three-dimensional parts are being irradiated. In the embodiment shown, cooling pathways 720 are pipes, but in other embodiments pathways 720 may be any structure that may contain a cooling fluid. In other embodiments, there is no cooling drum 505, and cooling channels are formed within drum 305.

Figure 8:
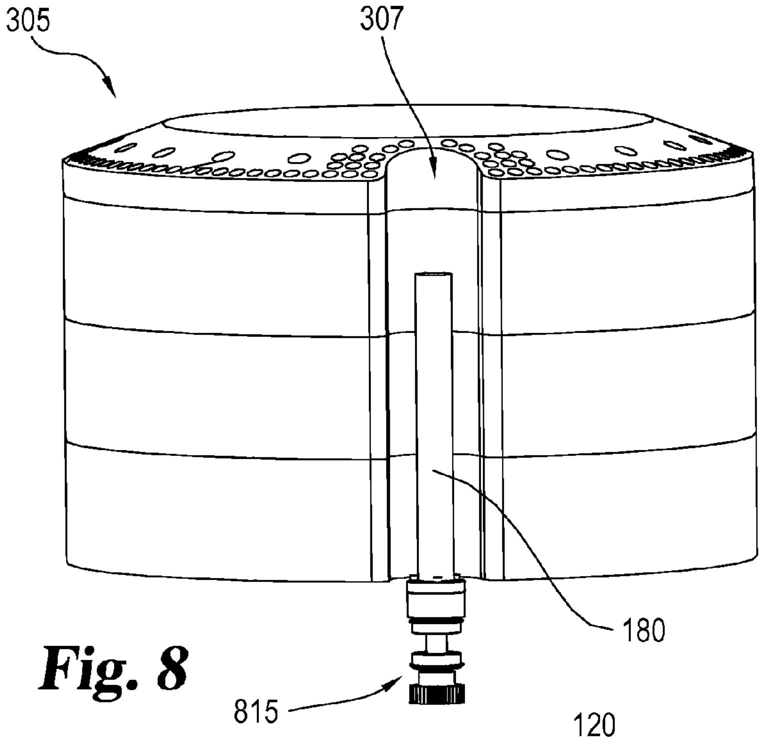
FIG. 8 is a front view of a rotation mechanism with a three-dimensional part loaded in the drum of FIG. 5.

In FIG. 8, end shield section 514 of drum 305 of FIG. 5 has been removed to show rotation mechanism 815 on which 3D part 180 sits when it is inserted into cavity 307. Rotation mechanism 815 is positioned within an opening in end shield section 514. 3D part 180 is positioned in drum 305 so it necessarily rotates as drum 305 rotates about drum 305's axis of rotation through the drum's center. However, rotation mechanism 815 gives 3D part 180 an additional rotational axis about the longitudinal center of part 180. The rotation of rotational mechanism 815 is independent of the rotation of drum 305, so part 180 can be rotated at a speed faster or slower than the speed of rotation of drum 305 even while drum 305 is rotating. A user may adjust the speed of rotation of part 180 within cavity 307 using a conventional speed control (not shown) that is independent of the rotation of drum 305. Also, in other embodiments not shown, rotation mechanism 815 may be modified to also allow translational motion of 3D part 180 within cavity 307, such as up and down, in addition to its two rotational axes or may be modified to add yet another rotational axis.

Figure 9:
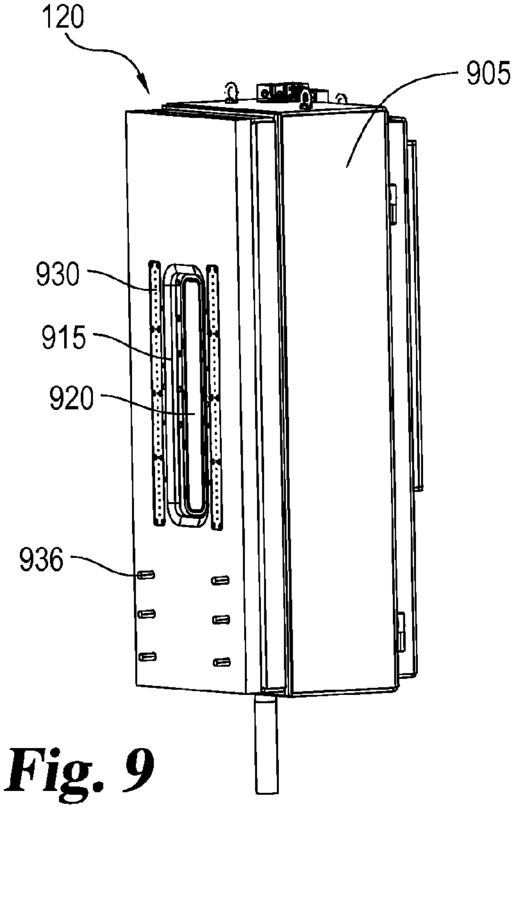
FIG. 9 is a perspective view of an electron beam emitter assembly as illustrated in the apparatus of FIG. 1.

Electron beam emitter assembly 120 is shown in FIG. 9. Beam emitter assembly 120 includes an emitter enclosure box 905, an emitter window 915, an electron beam emitter 920, and inert gas screens 930. The electron beam emitter 920 is preferably a standard sized, sealed e-beam emitter module that can be readily replaced upon failure of its window 915 (FIG. 9) or filament (not shown). See ebeam lamps of Comet Technologies USA, Inc. for suitable units.

An example of a suitable beam emitter assembly 120 includes either a sealed tube electron beam emitter or an actively pumped system with an external high voltage power supply. Electron beam emitter 920 has an accelerating potential from about 70-300 kV, where a range from 70-200 kV is preferred. The power of emitter 920 may be up to 200 kW with a power level of 1-100 kW preferred. Electrons are generated by filaments in a vacuum chamber which then pass through a metal foil window to irradiate a part that is at atmospheric pressure. Emitter window 915 is positioned so the distance from window 915 to 3D part 180 is a maximum of approximately 2 inches; however, it is preferred that 3D part 180 is about 0.25-1 inch from window 915. The above specifications for the beam emitter assembly 120 are simply preferred embodiments and are not meant to be limiting.

Emitter enclosure box 905 is a housing that includes a layer of shielding material such as lead that encases electron beam emitter 920. Box 905 includes emitter window 915 as an opening on the front face of enclosure box 905. Electron beam emitter 920 is positioned within box 905 so that the electron beam emitting side of emitter 920 is directed outward from emitter window 915. In the embodiment shown, two inert gas screens 930 are positioned on either side of emitter window 915. An inert gas source positioned behind inert gas screens 930 may be used to fill cavity 307 with an inert gas as it passes a screen 930. More preferably, cavity 307 is flushed with an inert gas at an earlier indexed location before cavity 307 reaches an active electron beam emitter, which additionally has further inert gas supply to minimize the generation of ozone and to minimize reactions with ambient elements during irradiation.

Emitter assembly 120 is positioned behind shield structure 160 so emitter window 915 aligns with the opening in back shield 316. The front panel of emitter assembly 120 fits within shield structure 160 so shield structure 160 keeps radiation from escaping from the front of assembly 120. Screws 936 near the bottom of emitter assembly 120 connect emitter assembly 120 to base 110 of FIG. 2. Other fasteners not shown, (but see FIG. 1) can be used to attach the electron beam emitter assembly to the drum assembly 140 near its upper, rear edge In the embodiment shown in FIG. 9, the electron beam emitter 920 has a rectangular shape, so emitter window 915 is also rectangular to match the shape of emitter 920. However, various types of electron beam emitters may be used within the system. The shape of window 915 may be varied in other embodiments to correspond to the shape of the emitter that is used with the apparatus.

Figure 10:
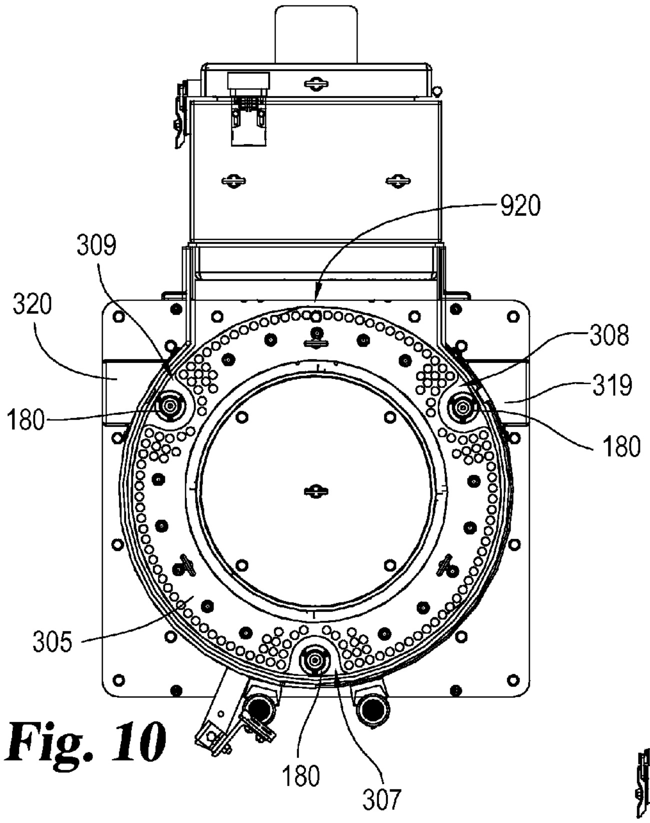
FIG. 10 is a top view of the apparatus of FIG. 1 with the top shielding removed to show the orientation of the drum in a loading position.

FIG. 10 is a top view of the apparatus of FIG. 1 with the top shielding removed to show the orientation of the drum 305 in a loading position. The loading position is a position where the cavity 307 into which 3D part 180 is to be loaded is in a position that is substantially free of radiation. Cavity 307 at the loading position is diametrically opposed from the electron beam emitter 920, and the other two cavities 308 and 309 are aligned with the notches in side shields 311, where cavities 308 and/or 309 can be flushed with inert gas while a treated part can be unloaded from cavity 307 and a new part put in its place. This provides an operator with access to cavity 307 while the cavity is not being blocked by shield structure 160, and ensures that the operator is not exposed to dangerous amounts of radiation, while at the same time, one or both of the other two cavities can be flushed with inert gas. The operator may be a human operator or may be a robot that loads part 180 automatically.

The operator inserts a 3D part 180 into cavity 307 so it is attached to rotation mechanism 815. While 3D part 180 is loaded into cavity 307, the other 3D parts that have been inserted into cavities 308, 309 in drum 305 are at locations where they are not exposed to radiation from electron beam emitter 920 (see FIG. 10) if it remains on during this interval. In the embodiment shown, the 3D parts in cavities 308, 309 are positioned adjacent to inert gas tube covers 319, 320, respectively. At this position, an inert gas, such as nitrogen, is supplied to cavities 308, 309 to minimize reaction with ambient elements while the part is irradiated. While drum 305 is in the loading position, electron beam emitter 920 may either be operating or turned off while drum 305 is in the loading position.

Once a part 180 has been fixed in cavity 307, drum 305 rotates so a 3D part 180 passes into an irradiation position in front of electron beam emitter 920. The rotation of drum 305 may be indexed so it starts and stops when reaching a specified location, or the rotation of drum 305 may be continuous, or it may speed up and slow down as is appropriate for optimizing the radiation, purging, loading, and unloading steps.

Figure 11:
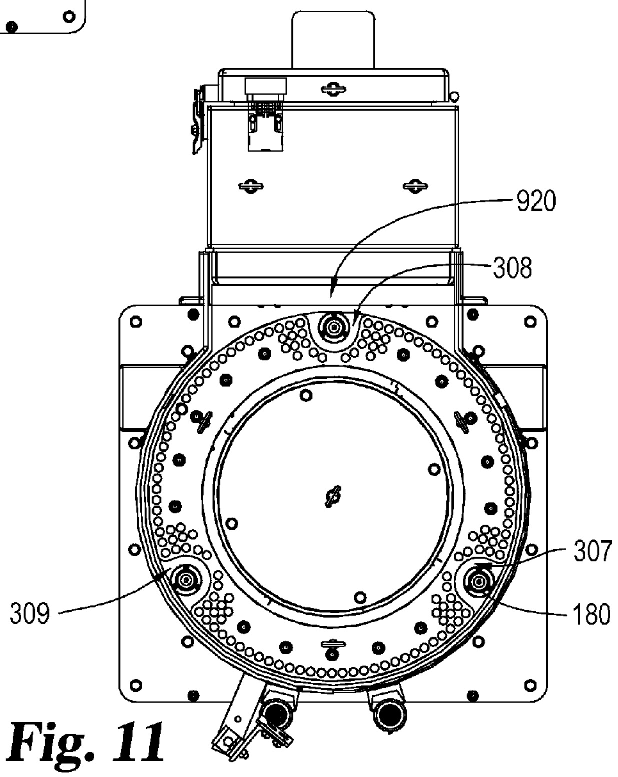
FIG. 11 is a top view of the apparatus of FIG. 1 with the top shielding removed to show the orientation of the drum in an irradiation position.

In FIG. 11, cavity 308 is in an irradiation position as it is passed in front of electron beam emitter 920. While drum 305 is rotating around a first axis, each 3D part 180 may also rotate within its respective cavities on a second axis, in the preferred case, the second axis being coincident with the longitudinal axis of the parts 180. Further longitudinal or rotational axes of motion of parts 180 could be added to assist in a more uniform irradiation of the part from multiple directions.

Rotating part 180 on the second axis of rotation within the cavity is beneficial for obtaining an even irradiation of part 180. Because electron beam emitter 920 is stationary, if part 180 were not rotated while in the irradiation position, only one side of part 180 would be exposed to direct beams of electrons. The side of part 180 that faces away from emitter 920 would only receive radiation reflected from the walls of cavity 307, plus a minimal amount that made its way through the part itself. However, if part 180 rotates within cavity 307 as the part rotates with drum 305, all sides of part 180 are exposed to direct beams of electrons from emitter 920.

The number rotations that part 180 makes while in the irradiation position may be varied. For example, in some embodiment, part 180 may only make one full rotation while in the irradiation position. In other embodiments, for example, part 180 may make eight complete turns while in the irradiation position.

While drum 305 is in the irradiation position shown in FIG. 11, there are several ways that radiation from electron beam emitter 920 is shielded from escaping outside apparatus 100. Shield structure 160 surrounds drum 305 and electron beam emitter 920 except for a portion of the drum at the loading position. Further shielding around electron beam emitter apparatus 120 is provided by a layer of lead or another suitable shielding material within the walls of apparatus 120. Drum 305 also constitutes a radiation shield for electron beam emitter 920 as material suitable for radiation shielding, like lead, may be used to fill holes 512, and used as a liner around the central volume of the drum. Direct radiation from emitter 920 contacts drum 305, and lead filled holes 512 act as a first line of shielding before the radiation reaches shield structure 160 or a central lead layer. The combination of these shielding features creates an apparatus that is effective at shielding radiation.

Alternate embodiments have different number of electron beam emitters. In some embodiments, for example, there are two electron beam emitters. Other embodiments may have more than two emitters.

Figure 13:
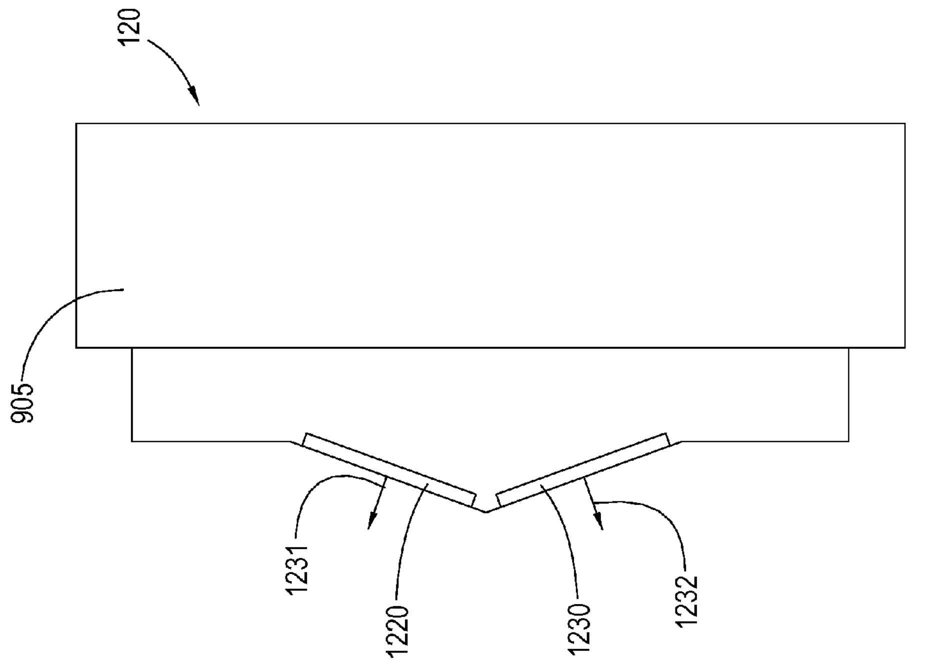
FIG. 13 is a side view of the electron beam emitter assembly of FIG. 12.
Figure 12:
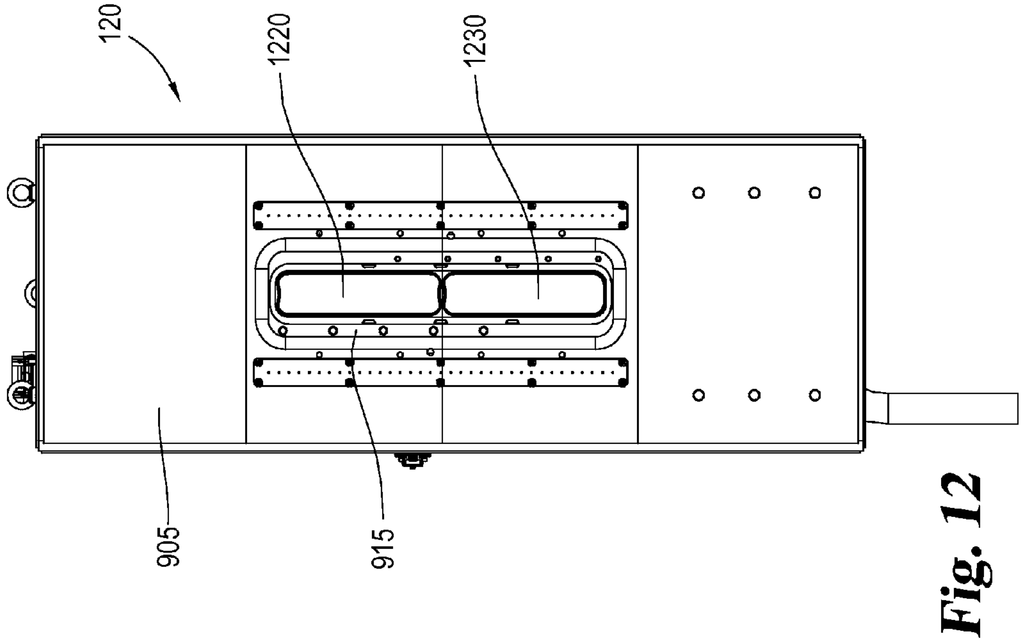
FIG. 12 is a front view of the electron beam emitter assembly of FIG. 9 with two electron beam emitters.

An embodiment with multiple emitters may have the emitters aligned in a series. For example, as seen in FIGS. 12 and 13, electron beam emitters 1220, 1230 are seen vertically stacked on each other within emitter window 915. For some embodiments, emitters 1220, 1230 are oriented so the average direction of beam emission 1221 and 1231, respectively, from each of the emitters is non-parallel (see FIG. 13). This allows the beams to be concentrated at different parts of cavity 307 when drum 305 is in an irradiation position so that part 180 is more uniformly irradiated, including the ends of the part. As an example, emitter 1220 could be positioned to better irradiate the top end of part 180 while emitter 1230 is positioned to better irradiate the bottom end of part 180.

Other emitter arrangements may also be used. For example, the emitters may be lined up horizontally rather than vertically. Also, more than two emitters may also be used to make various arrangements such as arranging four emitters into a 2×2 square.

Figure 14:
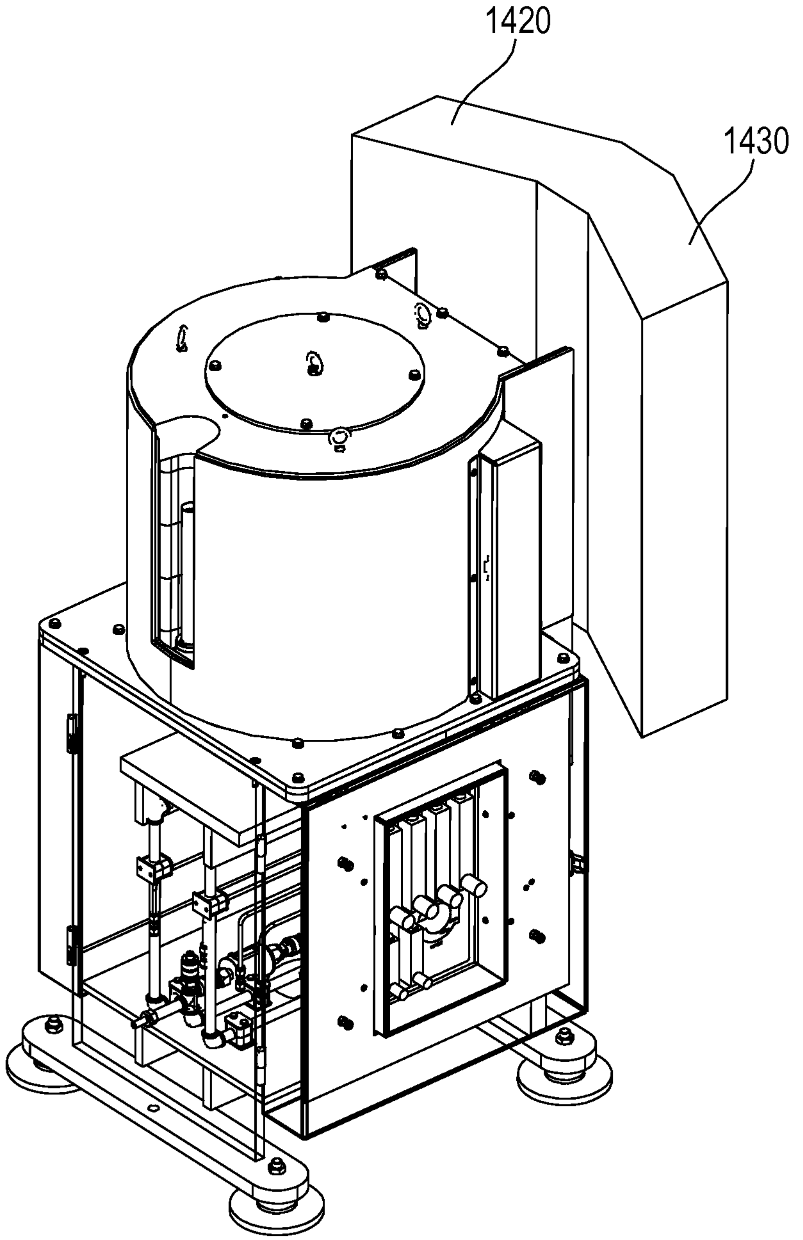
FIG. 14 is an alternate embodiment of the electron beam treatment apparatus of FIG. 1 with multiple electron beam emitters positioned at different angular positions on the axis of the drum.

Other embodiments may have multiple electron beam emitters where the emitters are spaced around the perimeter of drum 305 at different angular positions from the axis of drum 305. As seen in FIG. 14, there are two emitter assemblies 1420, 1430. These emitter assemblies 1420, 1430 may each have one electron beam emitter, or each may include multiple electron beam emitters arranged in various orientations as previously described.

While the invention has been illustrated and described in detail in the drawings and foregoing description, the same is to be considered as illustrative and not restrictive in character, it being understood that only the preferred embodiment has been shown and described and that all changes, equivalents, and modifications that come within the spirit of the inventions defined by following claims are desired to be protected. For example, even though a three cavity unit is disclosed, a one, two four, five or six or more cavity unit could be used.

The invention claimed is:

1. An apparatus for electron beam treatment of three-dimensional parts comprising:
- an electron beam emitter;
- a rotatable drum constituting a radiation shield for said electron beam emitter and having a generally cylindrical surface and two ends wherein said surface has a cavity on its generally cylindrical surface, with said cavity sized to fit a three-dimensional part to be treated;
- additional radiation shielding surrounding said electron beam emitter except for a portion of said rotatable drum, whereby the electron beam emitter is substantially shielded by the combination of the drum itself and the additional radiation shielding; and,
- wherein said rotatable drum is rotatable about a first axis from a loading position free of substantial radiation while said electron beam emitter is operating, to an irradiation position in which the parts are subject to the output of said electron beam emitter; and also including a part rotating mechanism having its axis of rotation positioned differently than the axis of rotation of said rotatable drum.

2. The apparatus of claim 1, which additionally comprises:
- a bearing for said rotatable drum that allows it to rotate from where said cavity is positioned in a loading position with the drum shielding positioned between said electron beam and said cavity, and an irradiation position where said cavity is positioned between said drum shielding and said electron beam.

3. The apparatus of claim 1, wherein said rotatable drum includes at least two cavities.

4. The apparatus of claim 3, wherein said rotatable drum is rotatable between a first position in which electrons from said electron beam enter said cavity and a second position in which the drum shielding is between the electron beam emitter and said cavity.

5. The apparatus of claim 1, wherein said rotatable drum includes three cavities.

6. The apparatus of claim 1, wherein said drum is made using steel.

7. The apparatus of claim 1, wherein said drum is made using lead.

8. The apparatus of claim 7, wherein said lead is part of an alloy with greater than 50% lead, and additionally including tin or antimony.

9. The apparatus of claim 1, wherein said drum is made using aluminum.

10. The apparatus of claim 1, wherein said drum is constructed from axially stacked sections.

11. The apparatus of claim 10, wherein said sections are comprised of a gear drive end, an intermediate section, and an end shield.

12. The apparatus of claim 1, additionally including an inert gas source positioned to purge said cavity at a location when the cavity is not positioned for direct exposure to radiation from said electron beam emitter.

13. The apparatus of claim 1, comprising fluid cooling pathways in the interior of said drum.

14. The apparatus of claim 13, wherein said rotatable drum is connected to a dual path rotation fluid connector.

15. The apparatus of claim 13 in which said cooling pathways comprise pipes.

16. The apparatus of claim 1, additionally comprising a robot to load and unload the three-dimensional part from said cavity when the cavity is positioned away from said electron beam emitter, with the shielding of said drum being between said emitter and said cavity.

17. The apparatus of claim 1, further comprising at least two electron beam emitters.

18. The apparatus of claim 17, in which said at least two electron beam emitter are oriented with their average directions of beam emissions being non-parallel.

19. The apparatus of claim 1, in which said part rotating mechanism includes a speed control that is independent of the rotation of said rotatable drum.

20. The apparatus of claim 1, wherein the rotation of said rotatable drum is continuous.

21. The apparatus of claim 1, that includes a part-positioning mechanism with at least 2 axes of part motion for a three-dimensional part in said cavity, the 2 axes being in addition to the axis of rotation of said rotatable drum.

22. The apparatus of claim 1, further comprising a second electron beam emitter positioned at a different angular position from the axis of said rotatable drum than the first electron beam.

23. The apparatus of claim 1, in which said electron beam emitter has an average direction of emitted electrons that irradiate a three dimensional part in said cavity in a first direction and additionally comprising a second electron beam emitter having an average direction of emitted electrons in a substantially different direction than said first electron beam emitter.

24. The apparatus of claim 23, in which said first direction is suitable for irradiating one of a part's end while the other direction is suitable for simultaneously irradiating the opposite end of the part as it is being rotated.

25. The apparatus of claim 1, wherein said electron beam emitter continuously remains in operation during the rotation of said rotating drum from said loading position to said irradiation position.

26. The apparatus of claim 1, wherein said electron beam emitter is disabled when said three-dimensional part is in said loading position.

27. The apparatus of claim 1, wherein said rotation mechanism rotates at a speed to allow said three-dimensional part at least two complete turns while the three dimensional part is in said irradiation position.

28. The apparatus of claim 27, wherein said rotation mechanism rotates at a speed to allow said three-dimensional part at least eight complete turns while the three dimensional part is in said irradiation position.

29. The apparatus of claim 1, wherein said rotatable drum comprises two sections fixed together.

30. An apparatus for electron beam treatment of material using an axially segmented drum comprising:
- an electron beam emitter;
- a rotatable drum having a generally cylindrical surface, positioned adjacent said electron beam emitter whereby material between said drum and electron beam emitter can be irradiated by said electron beam emitter; and
- wherein said drum is constructed from separate axially stacked sections fixed together.

31. The apparatus of claim 30, wherein said sections are comprised of a gear drive end, an intermediate section, and end shielding.

32. The apparatus of claim 30, in which two of said sections have many circular-cross-sectioned lead-containing pathways that align between sections.

33. An apparatus for electron beam treatment of three-dimensional parts comprising:
- an electron beam emitter;
- a rotatable drum constituting a radiation shield for said electron beam emitter and having a generally cylindrical surface;

wherein said drum includes circular-cross-section paths containing lead, tungsten, or uranium, or an alloy containing at least 50% lead with tin or antimony, to help shield radiation.

34. The apparatus of claim 33, wherein said paths are filled with solid lead that is continuous between holes in adjacent sections.

35. The apparatus of claim 33, wherein said paths are filled with lead shot.

36. The apparatus of claim 33 in which said paths were formed from drilling holes.

37. The apparatus of claim 33 in which said rotatable drum contains 20 of said circular-cross-section paths containing lead, tungsten, or uranium, or an alloy containing at least 50% lead with tin or antimony, to help shield radiation.

38. The apparatus of claim 37 in which said rotatable drum contains 50 of said circular-cross-section paths containing lead, tungsten, or uranium, or an alloy containing at least 50% lead with tin or antimony, to help shield radiation.

* * * * *